United States Patent [19]

Muroka et al.

[11] Patent Number: 5,014,245

[45] Date of Patent: May 7, 1991

[54] DYNAMIC RANDOM ACCESS MEMORY AND METHOD FOR WRITING DATA THERETO

[75] Inventors: Kazuyoshi Muroka; Takashi Ohsawa; Tohru Furuyama, all of Kanagawa, Japan

[73] Assignee: Kabushiki Kaisha Toshiba, Kanagawa, Japan

[21] Appl. No.: 540,770

[22] Filed: Jun. 20, 1990

[30] Foreign Application Priority Data

Jul. 20, 1989 [JP] Japan ............................ 1-188304

[51] Int. Cl.⁵ .............................................. G11C 7/00
[52] U.S. Cl. .................................. 365/194; 365/193; 365/233
[58] Field of Search ................... 365/194, 193, 233

[56] References Cited

U.S. PATENT DOCUMENTS 4,653,029 3/1987 Sato ................................... 365/208
4,757,476 7/1988 Fujishima et al. .................. 365/210

OTHER PUBLICATIONS

National Convention Record-1986; The Institute of Electronics and Communication Engineers of Japan; Part 2, pp. 2-247.

*Primary Examiner*—James W. Moffitt
*Attorney, Agent, or Firm*—Banner, Birch, McKie & Beckett

[57] ABSTRACT

A dynamic random access memory includes switching transistors connected between bit lines and a sensing amplifier. The switching transistors are made non-conductive during a first period. An internal write enable signal is supplied for a predetermined period to a data input circuit to write a data into a memory cell of the dynamic random access memory. The predetermined period is controlled to terminate after the termination of the first period at an early write mode.

8 Claims, 8 Drawing Sheets

FIG. I
PRIOR ART

DYNAMIC RANDOM ACCESS MEMORY AND METHOD FOR WRITING DATA THERETO

BACKGROUND OF THE INVENTION

1. Field of the Invention

This invention concerns a dynamic random access memory (hereafter called DRAM) device. More particularly, this invention concerns a DRAM device which includes switching transistors between bit lines and a sensing amplifier.

2. Description of Related Art

The current discharged to the bit lines of a DRAM device during a read operation is increased in proportion to the increase in the capacitance of the bit lines. The increased capacitance causes a reduction in the sensing speed of a sensing amplifier which senses the voltage difference between the bit lines.

To increase the sensing speed, a DRAM device which includes switching transistors has been proposed. (see: National Convention Record, 1986 The Institute of Electronics and Communication Engineering of Japan, Part 2, P247)

FIG. 1 is a circuit diagram of a conventional DRAM device which includes a switching circuit 2. The switching circuit 2 includes two switching transistors CT1 and CT2 which are connected between a precharge/equalize circuit 1 and an active restore circuit 3. The precharge/equalize circuit 1 equalizes the potentials of the bit lines BL1 and BL2 and precharges them to half the voltage (½ Vcc) of the power source voltage Vcc. The precharge/equalize circuit 1 is activated and controlled by a precharge/equalize signal EQL.

Numeral 4 designates a sensing amplifier which includes two N-type MOS transistors N1 and N2. The respective gate electrodes of the MOS transistors N1 and N2 are connected to a respective sensing node SN1 and SN2, respectively.

The two sensing nodes SN1 and SN2 are connected to data lines DQ1 and DQ2 through column select transistors ST1 and ST1. The sensing amplifier 4 is activated and controlled by a latch signal L which is supplied to the gate of an N-type MOS transistor N3.

The data lines DQ1 and DQ2 are connected to the output terminals of inverters IV1 and IV2 which constitute a part of a data writing circuit DW. The two inverters IV1 and IV2 are supplied with output signals from the OR gates G1 and G2. The OR gates G1 and G2 are supplied with a complementary data signals DATA and $\overline{\text{DATA}}$ and an internal write enable signal WEi.

Referring to FIG. 2, a read and restore operation for the circuit illustrated in FIG. 1 will be explained. Assume that the memory cell MC1 connected to the bit line BL1 stores a Low level data (zero volt), and the bit lines BL1 and BL2 are precharged to half the voltage (½ Vcc) of the power source voltage Vcc.

When the word line WL1 is selected and the charge transfer transistor TM becomes conductive, the Low level data is read from the memory capacitor Cs. Thus, the potential of the bit line BL1 is lowered slightly from the ½ Vcc.

On the other hand, the dummy word line DWL2 is simultaneously selected when the word line WL1 is selected, and the charge transfer transistor TD in the dummy cell DC2 becomes conductive. Since the dummy cell capacitor Cd stores the ½ Vcc level, the potential of the bit line BL2 does not change from the ½ Vcc voltage.

In this condition, the potential of the bit enable signal BC becomes the ground potential Vss and the switching transistors CT1 and CT2 become non-conductive. Thus, the bit lines BL1 and BL2 are separated from the sensing amplifier 4 and the active restore circuit 3.

In this condition, by activating the sensing amplifier 4 by supplying a Vcc level latch signal L to the gate of the MOS transistor N3, the slight difference voltage between the bit lines BL1 and BL2 is sensed by the sensing amplifier 4 and the potential of the sensing node SN1 is lowered to the Vss level.

When the active restore circuit 3 is activated by being supplied with a Vcc level active restore signal AR, the potential of the sensing node SN2 is pulled-up to the Vcc level.

Then, the column select transistors ST1 and ST2 become conductive in response to a column decode signal CSLi, the potentials of the sensing nodes SN1 and SN2 are transferred to the data lines DQ1 and DQ2, and are amplified by the data buffer 5. The output of the data buffer 5 is then output to the data bus DL1 and DL2.

Then, the potential of the BC signal returns to the high level and the switching transistors CT1 and CT2 become conductive. Thus, the bit lines and the sensing nodes are connected, and the pontential of the bit line BL1 is lowered to the Vss level and the potential of the bit line BL2 is pulled-up to the Vcc level. In this way, the restore operation to the memory cell MC1 and the dummy cell DC2 is performed.

Thereafter, the selection of the word line WL1 and the dummy word line DWL2 is released. Then, the precharge/equalize circuit 1 is activated in response to the precharge/equalize signal EQL, and the bit lines BL1 and BL2 are precharged to ½ Vcc level.

In this way, the sensing speed is increased, since the large capacitances of the bit lines BL1 and BL2 are separated from the sensing amplifier 4 during the sensing operation except during the initial sensing period.

FIG. 3 is another conventional DRAM device which includes switching transistors. In this DRAM device, the switching transistors CT1 and CT2 are connected between the active restore circuit 3 and the sensing amplifier 4. Namely, the active restore circuit 3 is directly connected to the bit lines BL1 and BL2. Thus, the bit lines BL1 and BL2 are directly pulled-up to the Vcc potential by the active restore circuit 3. Therefore, the voltage drop due to the switching transistors CT1 and CT2 is solved, and the bit line potential is pulled-up to the Vcc level.

FIG. 4 is a timing chart showing a read and restore operation of the DRAM device of FIG. 3. As shown in FIG. 4, the switching transistors CT1 and CT2 are rendered non-conductive during the read period by being supplied with the low level BC signal. Thus, the sensing speed is increased, since the large capacitance due to the bit lines is separated from the sensing amplifier 4 during the sense operation except during the initial read period.

Referring now to FIGS. 5 to 8, a write operation will be explained. A row address signal (not shown) and a column address signal (not shown) are successively input from an external circuit, e.g., a CPU (Central Processor Unit), and a row address stored signal $\overline{\text{RAS}}$ is activated after the row address signal is input. Then, the row address signal is decoded by a row address decoder (not shown), and is applied to the word line WL1, for example. The column address signal is decoded by a column address decoder (not shown), and is applied to the column select transistors ST1 and ST2 as a column decode signal CSLi, for example.

The inventors of the present invention attempted to modify a bit enable signal generator 100 and an internal write enable signal generator 200 shown in FIGS. 5 and 6 to more effectively produce the bit enable signal BC and the internal write enable signal WEi, respectively.

Namely, the bit enable signal generator 100 shown in FIG. 5 includes a delay circuit 10 which receives the $\overline{RAS}$ signal. The output signal of the delay circuit 10 is applied to a NAND gate 14 through an inverter 11. The output of the inverter 11 is also applied to the NAND gate 14 through a delay circuit 12 and inverter 13.

The bit enable signal generator 100 generates a bit enable signal BC in response to the $\overline{RAS}$ signal. The low level period of the bit enable signal BC is determined by the delay time of the delay circuit 12.

The internal write enable signal generator 200 shown in FIG. 6 includes a delay circuit 20 which receives the $\overline{RAS}$ signal. The output signal of the delay circuit 20 is applied to a NOR gate 21. The NOR gate 21 is also supplied with the $\overline{CAS}$ signal and an external write enable signal $\overline{WE}$. The output signal of the NOR gate 21 is applied to a NAND gate 26 through two inverters 22 and 23. The output signal of the inverter 23 is also applied to the NAND gate 26 through a delay circuit 24 and an inverter 25.

If the external write enable signal $\overline{WE}$ is activated after the activation of the $\overline{CAS}$ signal, the falling of the internal write enable signal $\overline{WEi}$ is determined by the falling of the external write enable signal $\overline{WE}$, and the rising thereof is determined according to the delay time t3 of the delay circuit 24. Thus, by adjusting the delay time of the delay circuit 24 based on the timing of the BC signal, it is possible to insure the rising of the internal write enable signal $\overline{WE}$ after the rising of the bit enable signal BC.

However, when the external write enable signal $\overline{WE}$ is activated earlier than the $\overline{CAS}$ signal, namely at an early write mode, the rising of the internal write enable signal WEi is determined or responsive to the rising of the external write enable signal $\overline{WE}$. Thus, the internal write enable signal $\overline{WEi}$ occasionally rises earlier than the rising of the bit enable signal BC.

In this condition, the switching transistors CT1 and CT2 are non-conductive. Thus, the input data can be transferred to the sensing amplifier 4, but not to the bit lines BL1 and BL2. Therefore, if the input data DATA and $\overline{DATA}$ are opposite with respect to the data of the bit lines, the data of the sensing amplifier 4 may be destroyed by the potential of the bit line when the switching transistor becomes conductive. Namely, as shown in FIG. 8, the voltages of the sensing nodes SN1 and SN2 are pulled to the voltages of the bit lines BL1 and BL2.

The same problem exists in the circuit of FIG. 1.

SUMMARY OF THE INVENTION

Therefore, an object of the present invention is to provide a DRAM device in which data is certainly written even in an early write mode.

Another object of the present invention is to provide a method of writing data into a memory cell in a DRAM device by which data is certainly written even if in an early write mode.

To achieve the objects, this invention provides a dynamic random access memory device in which a write operation is performed responsive to an internal write enable signal generated from a row address strobe signal, a column address strobe signal and an external write enable signal, comprising: memory cell means for storing a data; first and second bit lines being coupled to the memory cell means; sensing means for sensing the voltage difference between the bit lines; switching means connected between the sensing means and the memory cell means, for transferring the data stored in the memory cell means to the sensing means; first circuit means for generating a first control signal for making the switching means non-conductive during a first predetermined period; input means for inputting a data to the memory cell means through the bit lines responsive to the internal write enable signal; and second circuit means for generating the internal write enable signal, including delay means for delaying the termination of the internal write enable signal for a prescribed time after the termination of the first predetermined period if the external write enable signal occurs before the column address signal.

Furthermore, this invention provides a method of writing data into a dynamic random access memory device including a switching transistor connected between bit line and sensing means, at a memory cell selected by a row address signal signal and a column address signal in response to an internal write enable signal, comprising the steps of:

providing a row address strobe signal for accepting the row address signal; providing a column address strobe signal for accepting the column address signal; providing an external write enable signal for enabling the writing of the data; selecting the memory cell in response to the row address signal and the column address signal; generating a first control signal for activating the switching transistor; generating an internal write enable signalin the dynamic random access memory from the row address strobe signal, the column address signal and the external write enable signal; maintaining the internal write enable signal until a prescribed time after the termination of the first control signal if the external write enable signal occurs before the column address signal; and writing said data into said selected memory cell in response to the internal write enable signal.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Referring now to drawings, an embodiment of the present invention will be explained.

Figure 8:
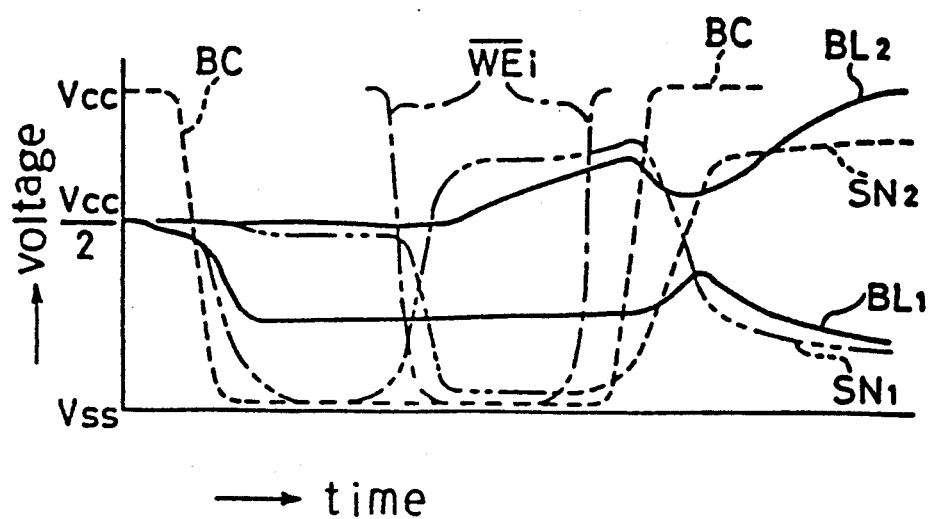
FIG. 8 is a timing chart at the early write mode according to the circuits of FIGS. 5 and 6.
Figure 9:
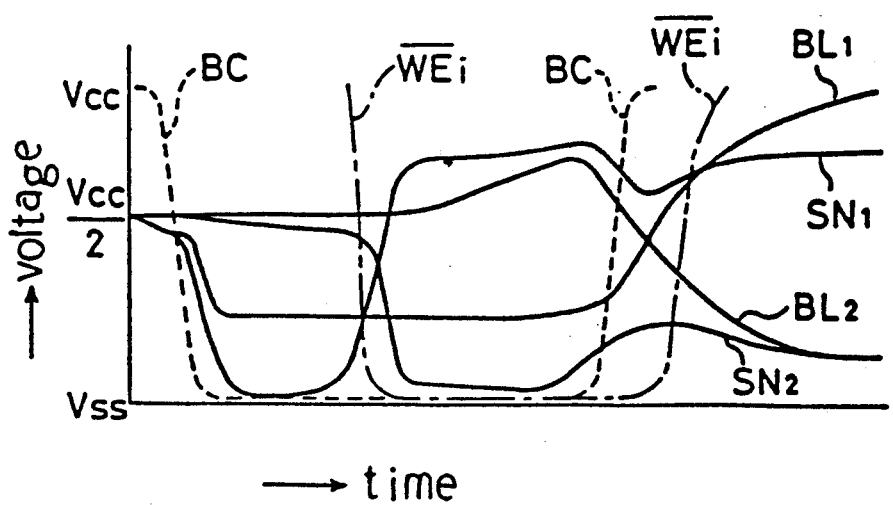
FIG. 9 is a timing chart showing the operation at the early write mode according to the present invention.

FIG. 9 is a timing chart showing the operation of the invention in the early write mode. The difference between the timing chart of FIG. 8 and FIG. 9 is the timing of the recovery of the internal write enable signal $\overline{WEi}$ with respect to the bit enable signal BC. Namely, the internal write enable signal $\overline{WEi}$ is controlled to rise after the bit enable signal BC rises even if the circuit is in the early write mode.

Figure 10:
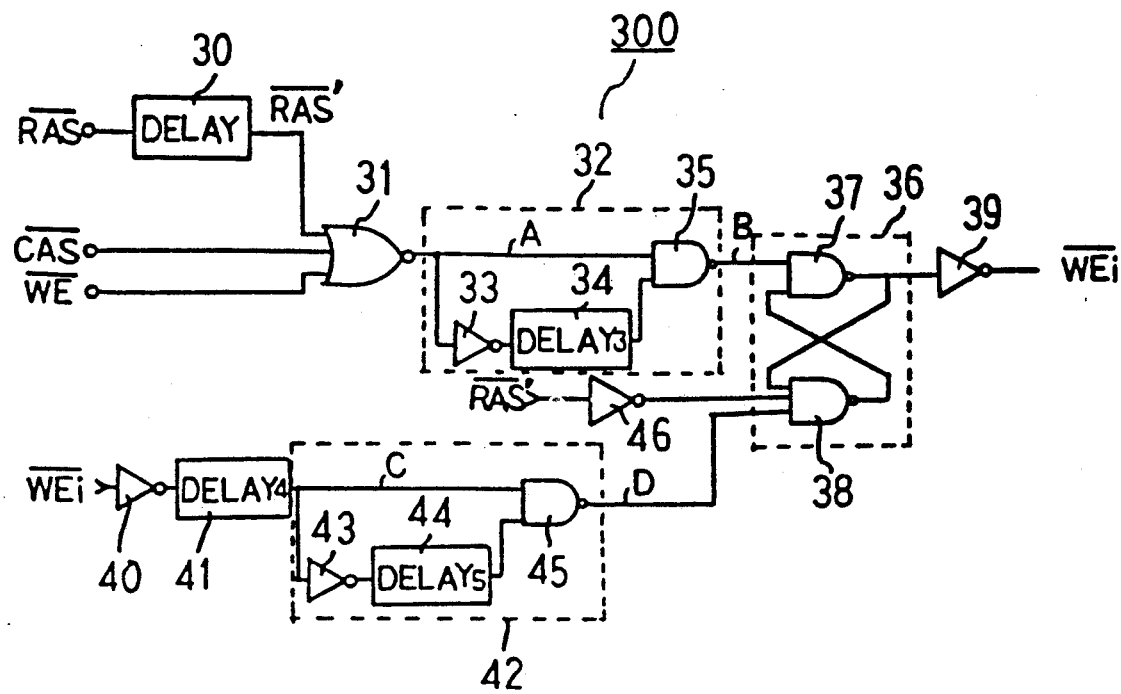
FIG. 10 is a circuit diagram of a first embodiment of an internal write enable signal generator according to the present invention.
Figure 11:
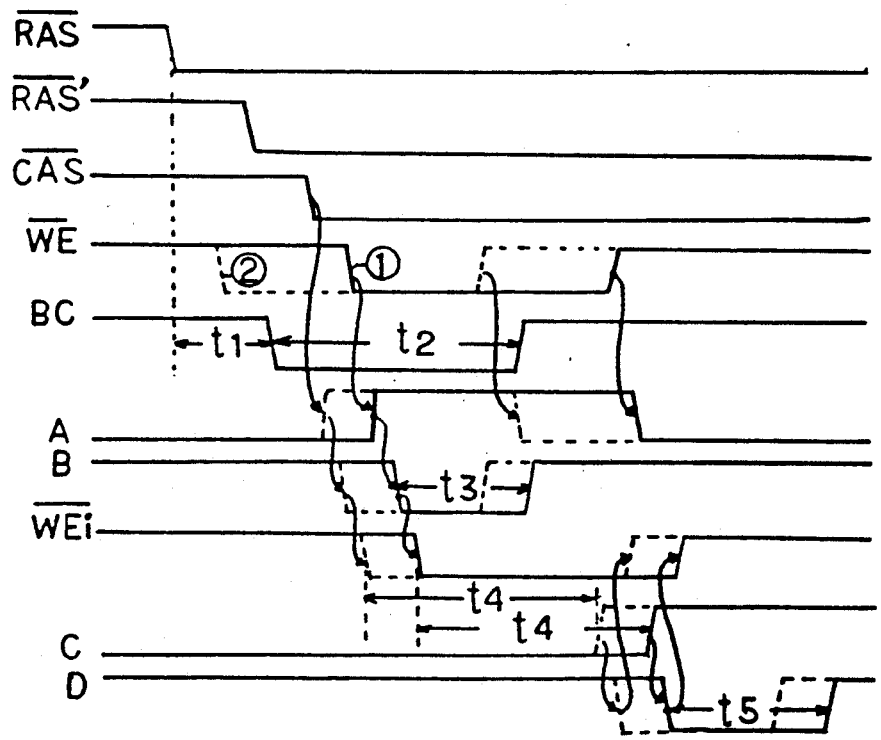
FIG. 11 is a timing chart showing the operation of the first embodiment.

Referring now to FIGS. 10 to 11, the first embodiment of the present invention will be explained. FIG. 10 is a circuit diagram of an internal write enable signal generator 300. The internal write enable signal generator 300 includes a delay circuit 30 which receives the $\overline{RAS}$ signal. The output of the delay circuit 30 is applied to a NOR gate 31. The NOR circuit 31 also receives a $\overline{CAS}$ signal and an external write enable signal $\overline{WE}$.

The output of the NOR circuit 31 is applied to a first pulse generator 32. The pulse generator 32 comprises a NAND gate 35, an inverter 33 and a delay circuit 34. Namely, the output of the NOR gate 31 is directly applied to the NAND gate 35, and also is applied to the NAND gate 35 through the inverter 33 and the delay circuit 34. The output of the pulse generator 32 is applied to a flip-flop circuit 36 as a first input signal thereto. The flip-flop 36 comprises two NAND gates 37 and 38 which are cross coupled to each other. The output of the flip-flop 36 is applied to an inverter 39. The output of the inverter 39 is used as the internal write enable signal $\overline{WEi}$.

The internal write enable signal $\overline{WEi}$ is also applied to an inverter 40. The output of the inverter 40 is applied to a second pulse generator circuit 42 through a delay circuit 41. The second pulse generator 42 comprises a NAND gate 45, an inverter 43 and a delay circuit 44. The output of the delay circuit 41 is directly applied to the NAND gate 45, and is also applied to the NAND gate 45 through the inverter 43 and the delay circuit 44.

The output of the generator circuit 42 is applied to the NAND gate 38 of the flip-flop circuit 36 as a second input signal thereto. The NAND gate 38 also receives a delayed $\overline{RAS}$ signal through an inverter 46. The delayed $\overline{RAS}$ signal applied to the flip-flop 36 through the inverter 46 is used for a initialization of the flip-flop circuit 36.

Figure 5:
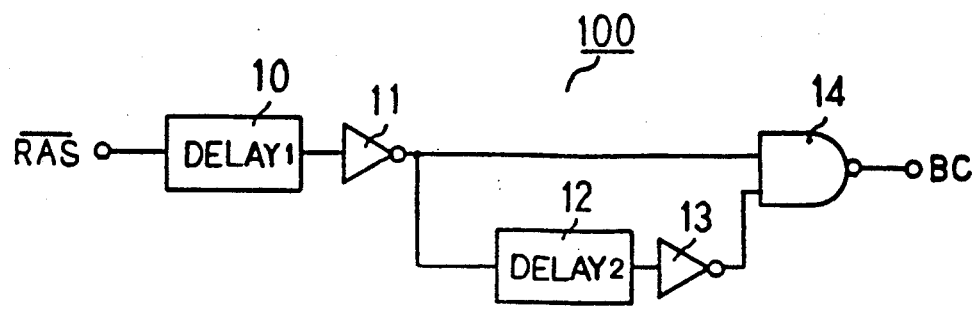
FIG. 5 is a circuit diagram of a bit enable signal generator.
Figure 6:
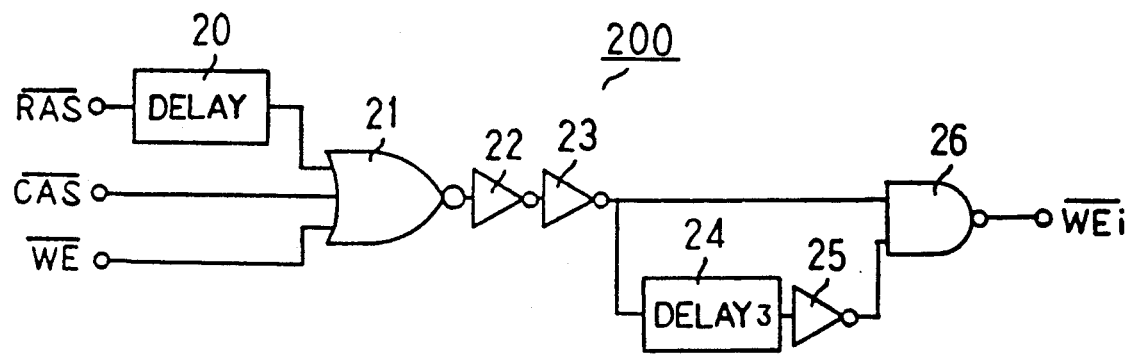
FIG. 6 is a circuit diagram of an internal write enable signal generator attempted by the inventors of the present invention.
Figure 7:
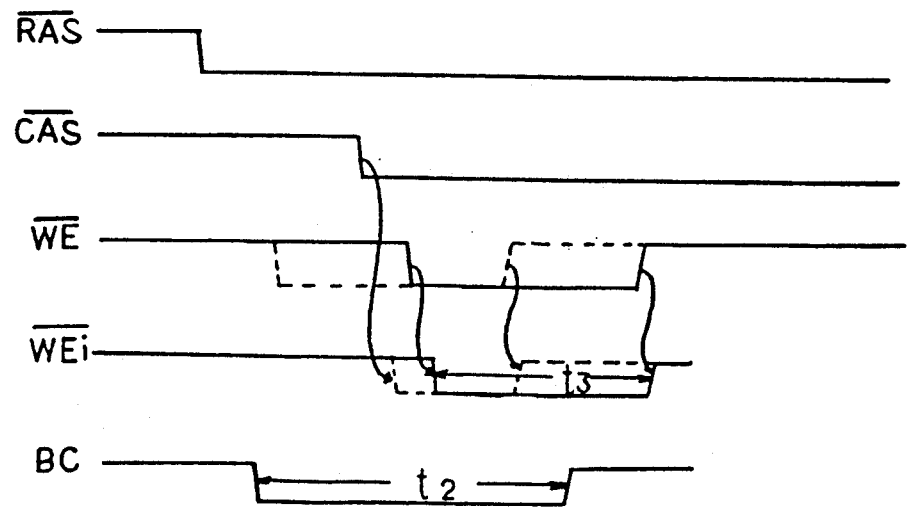
FIG. 7 is a timing chart showing the operation of the bit signal generator 100 and the internal write enable signal generator 200 shown in FIG. 5 and FIG. 6.

FIG. 11 shows a timing chart of the internal write enable signal generator 200 of FIG. 10. FIG. 11 also includes the bit enable signal BC. The bit enable signal generator of FIG. 5 can be used for generating the bit enable signal BC.

In the case where the external write enable signal $\overline{WE}$ is activated after the activation of the $\overline{CAS}$ signal (shown by line 1), the output signal of the NOR gate 31 (hereafter called signal A) becomes low level in response to the falling of the $\overline{CAS}$ signal. Then, in response to the rising of the signal A, the output signal of the NAND gate 35 (hereafter called signal B) is changed to low level. Therefore, the signal B is changed to high level a predetermined time t3 later. The delay time t3 is determined by the delay circuit 34. In response to the change of the signal B to the low level, the internal write enable signal $\overline{WEi}$ is changed to the low level.

When the output of the delay circuit 41 (hereafter called signal C) is changed to high level a predetermined time t4 later with respect to the falling of the internal write enable signal $\overline{WEi}$, the output of the NAND gate 45 (hereafter called signal D) is changed to low level. The delay time t4 is determined by the delay circuit 41. In response to the falling of the signal D, the internal write enable signal WEi is changed to the high level. Namely, the rising of the internal write enable signal $\overline{WEi}$ is determined by the delay time t4 of the delay circuit 41.

In the case where the external write enable signal WE is activated before the $\overline{CAS}$ signal, namely in the early write mode (shown by line 2), the rising of the signal A is determined by the falling of the $\overline{CAS}$ signal. Therefore, the falling of the signal B and the internal write enable signal $\overline{WEi}$ are determined by the falling of the $\overline{CAS}$ signal. Then, the signal C is changed to the high level the predetermined time t4 later with respect to the falling of the internal write enable signal $\overline{WEi}$, and the signal D is changed to the low level. In response to the falling of the signal D, the internal write enable signal $\overline{WEi}$ is changed to the high level.

Namely, according to the first embodiment, the rising of the internal write enable signal $\overline{WEi}$ is determined or controlled by the delay time t4 with respect to the falling of the external write enable signal $\overline{WE}$ or the $\overline{CAS}$ signal. Thus, it is possible to insure the rising of the internal write enable signal $\overline{WEi}$ after the rising of the bit enable signal by adjusting the delay times of the delay circuits 10, 30 and 41 of the bit enable signal generator 100 and the internal write enable signal generator 300.

Figure 12:
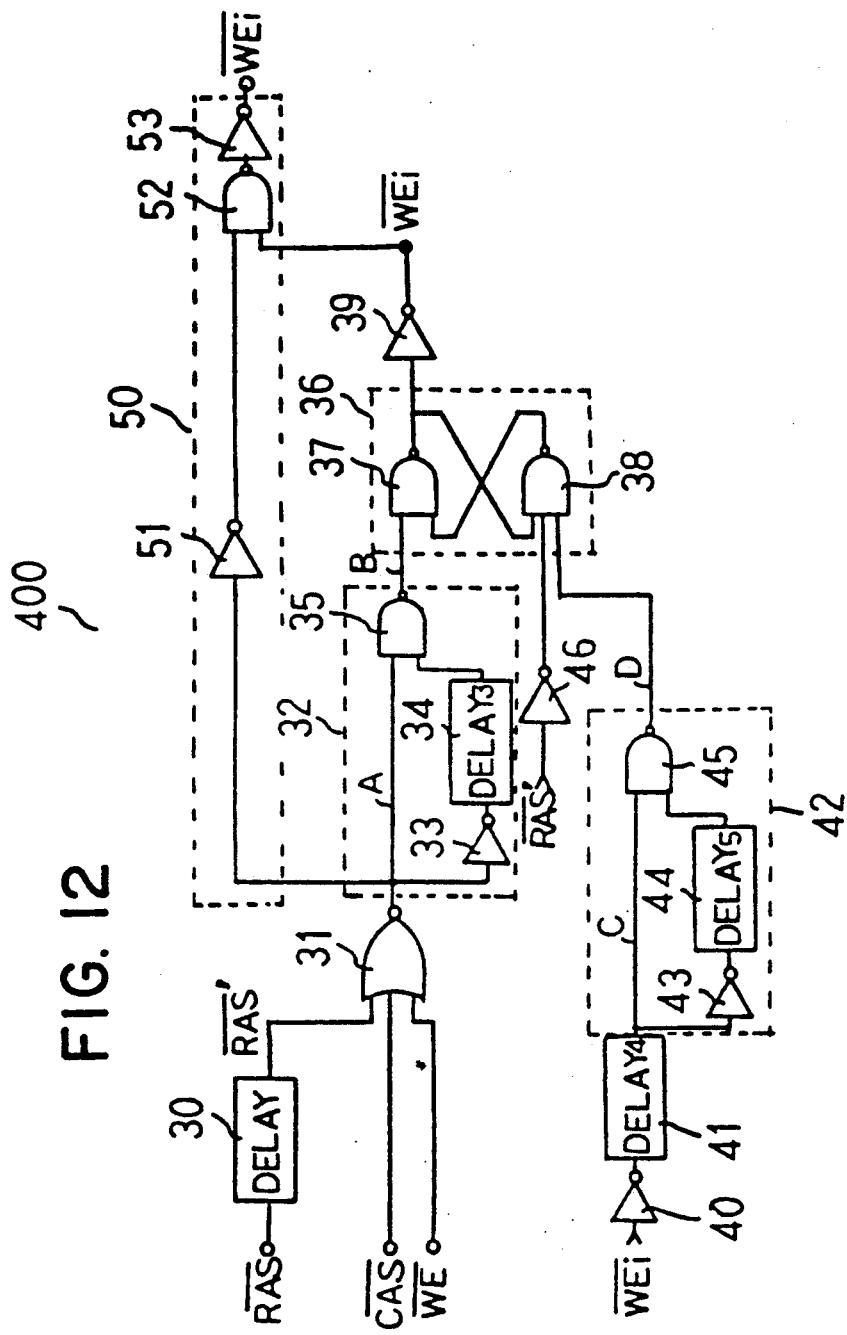
FIG. 12 is a circuit diagram of a second embodiment of the internal write enable signal generator according to the present invention.

FIG. 12 is a circuit diagram of second embodiment of the present invention. In this embodiment, two inverters 51 and 53 and a NAND gate 52 are added with respect to the first embodiment of FIG. 10. Namely, the output of the NOR gate 31 is applied to the NAND gate 52 through the inverter 51, and also the output of the inverter 39 is applied to the NAND gate 52. The output of the NAND gate 52 is applied to the inverter 53, and the output of the inverter 53 is used as an internal write enable signal $\overline{WEii}$.

Figure 13:
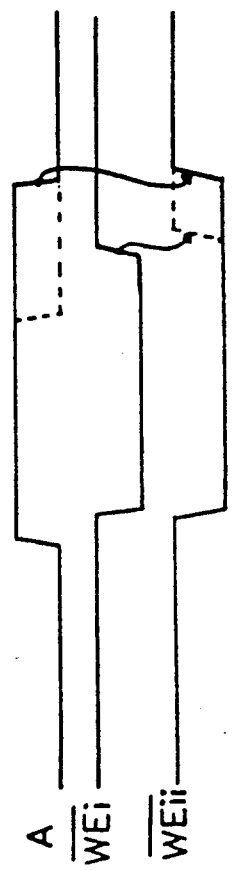
FIG. 13 is a timing chart showing the operation of the second embodiment.

FIG. 13 is a timing chart of the internal write enable signal generator 400 of FIG. 12. In FIG. 13, only three signals are shown, since the other part is the same as the timing chart of FIG. 11. In the internal write enable signal generator 400, the rising of the internal write enable signal $\overline{WEii}$ is determined by the timing of which comes later, the falling of the signal A or the rising of the output signal $\overline{WEi}$ of the inverter 39. In other words, the rising of the internal write enable signal $\overline{WEii}$ is controlled by the external write enable signal $\overline{WE}$, since the falling of the signal A is responsive to the rising of the external write enable signal $\overline{WE}$.

Of course, the rising of the internal write enable signal WEii after the bit enalbe signal BC is insured, since the output signal of the inverter 39 rises after the rising of the bit enable signal BC by the arrangement of FIG. 10.

Furthermore, in the aforementioned embodiment, the voltage of the bit enable signal BC is lowered to the ground level Vss to make the switching transistors CT1 and CT2 non-conductive. However, it is possible to adopt an intermediate potential VM between the ground level Vss and the power source voltage Vcc to make the switching transistors non-conductive.

For example, an intermediate potential VM which meets the following condition may be used.

$$VM \leq VBL + Vtn \quad (1)$$

wherein Vtn is the threshold voltage of the switching transistors. More concretely, 2.5 volt is used as the intermediate voltage when the power source voltage Vcc is 5.0 volt.

Figure 1:
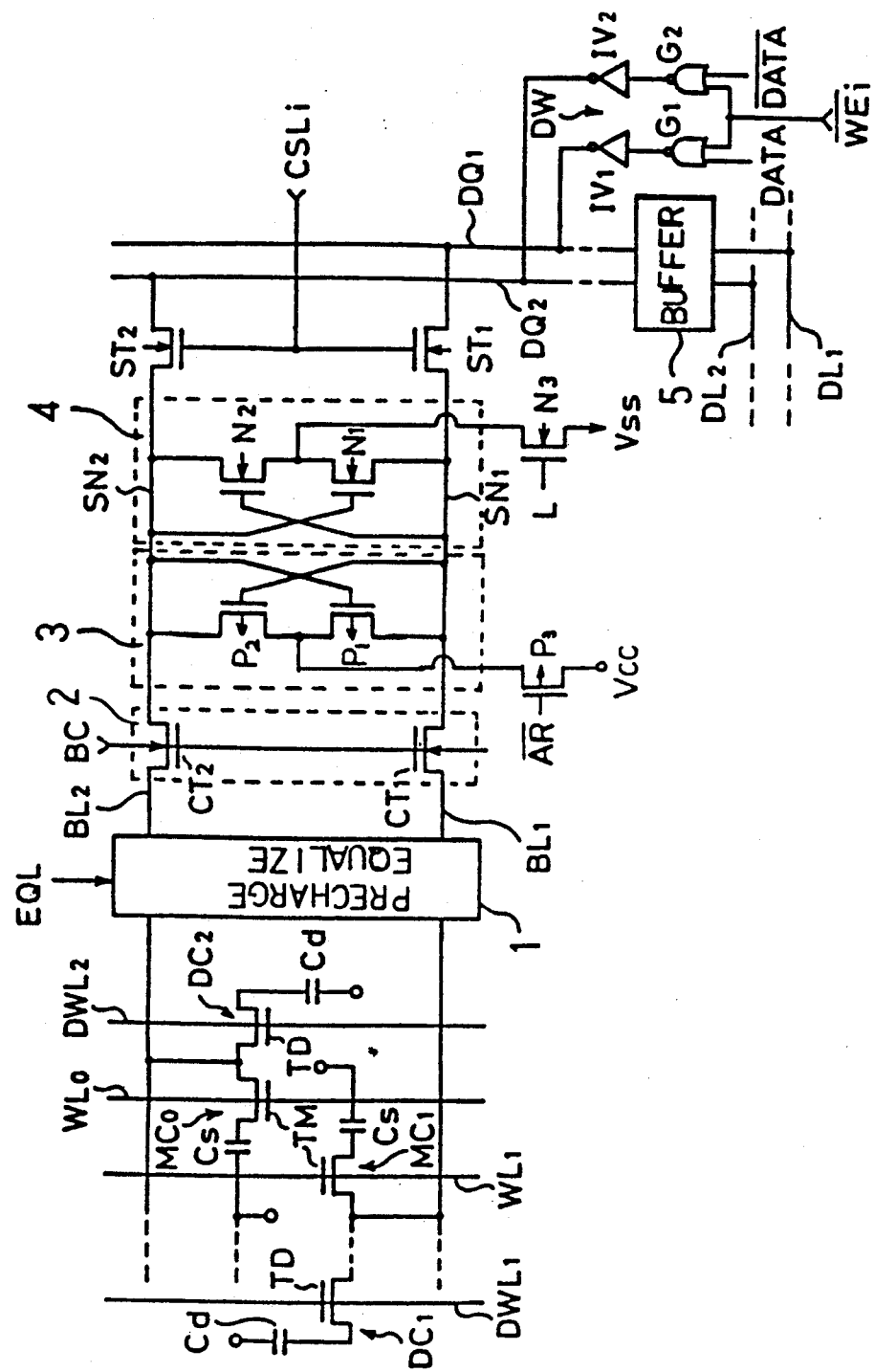
FIG. 1 is a circuit diagram of a conventional DRAM device which includes switching transistors between the bit lines and the sensing amplifier.
Figure 2:
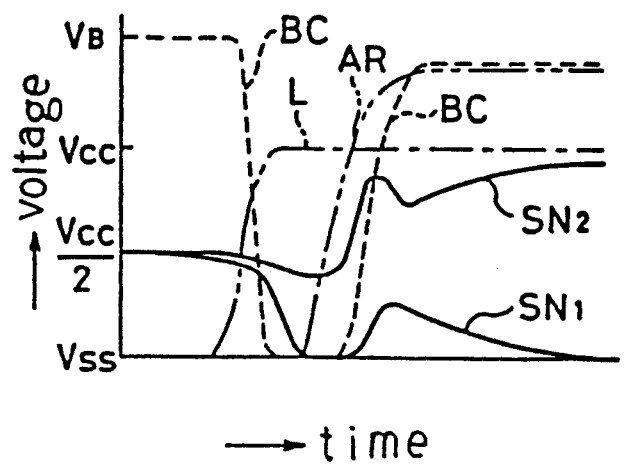
FIG. 2 is a timing chart showing the read and restore operation of the DRAM device of FIG. 1.
Figure 4:
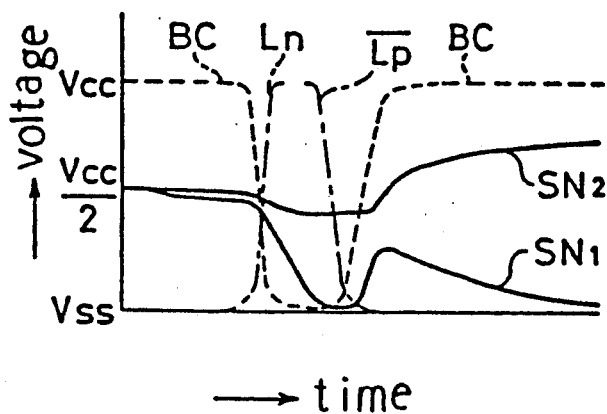
FIG. 4 is a timing chart showing the read and restore operation of the DRAM device of FIG. 3.
Figure 3:
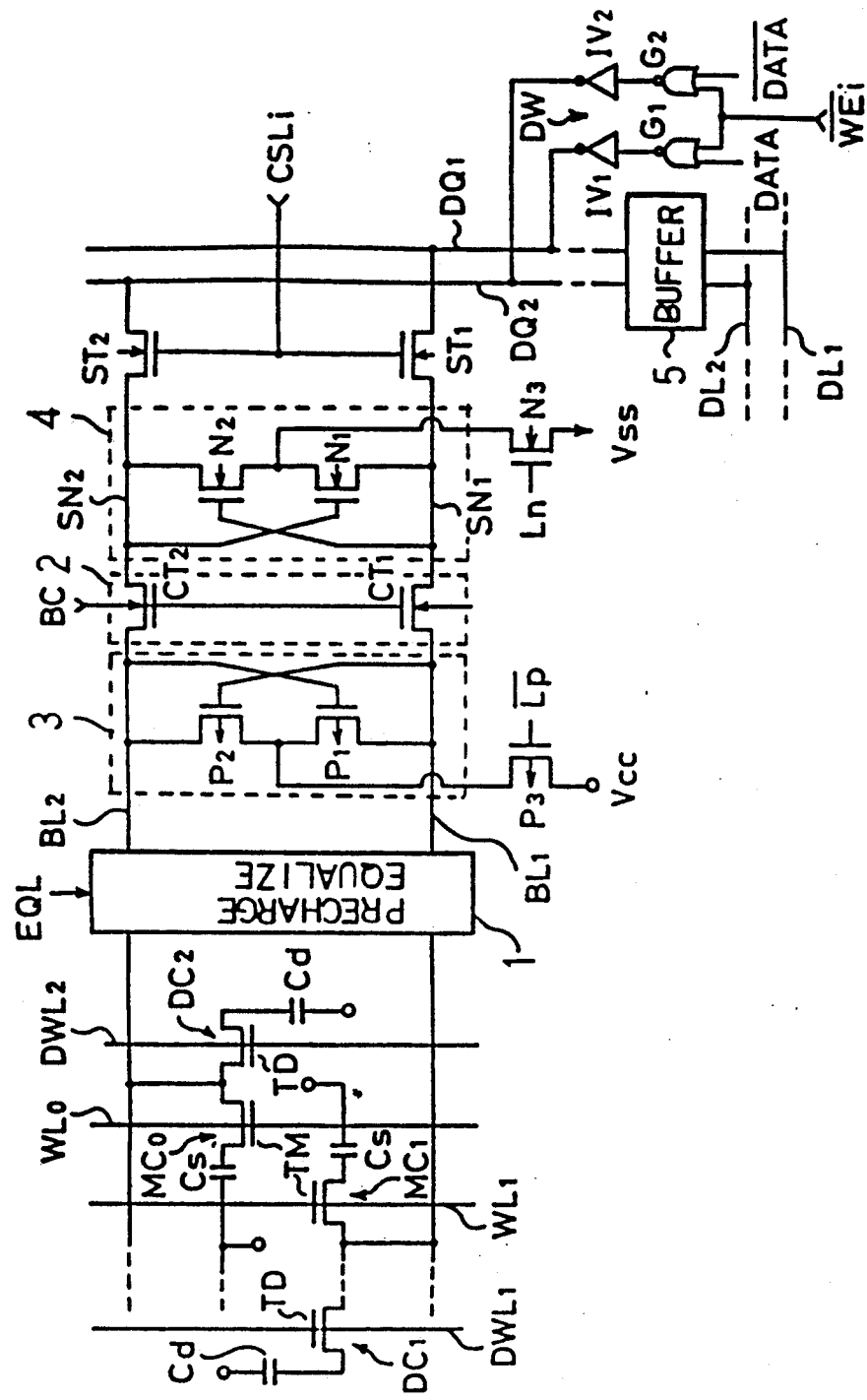
FIG. 3 is a circuit diagram of another conventional DRAM device which includes switching transistors.
Figure 14:
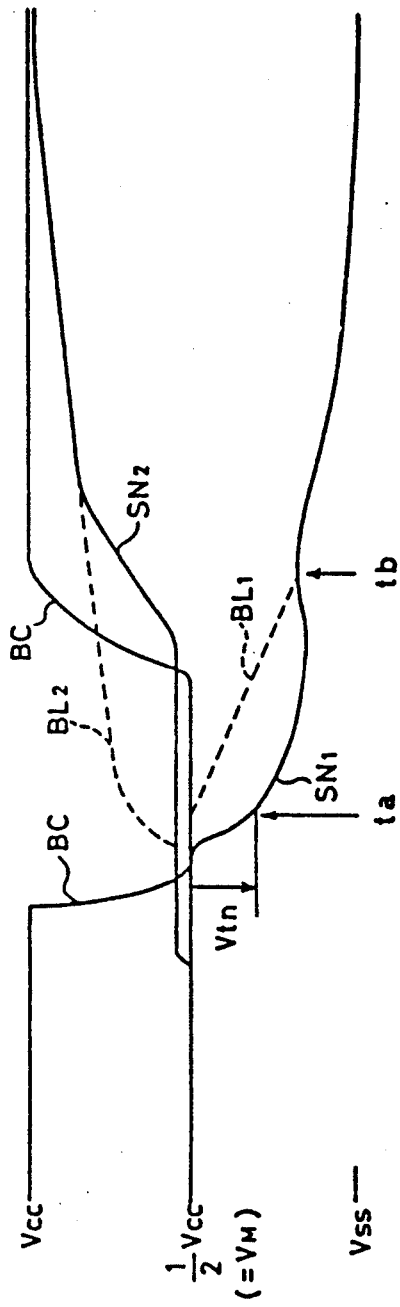
FIG. 14 is a timing chart showing the operation of the invention when an intermediate voltage is used for the bit enable signal.

By adopting the intermediate voltage VM, an additional benefit is achieved as follows. FIG. 14 shows a timing chart of a read operation of a DRAM device when the intermediate voltage VM is used for the bit enable signal BC in the DRAM device in FIG. 3. In the same way as previously explained, the potential of signal BC is lowered to the intermediate potential VM when a slight difference in voltage is achieved between the bit lines to speed-up the sensing speed.

When the voltage difference between the sensing node SN1 and the BC voltage becomes greater than the threshold voltae Vtn of the switching transistor CT1, the impedance of the switching transistor CT1 is gradually reduced and the potential of the bit line BL1 gradually closes to the potential of the sensing node SN1.

Thus, when the BC signal equals the Vcc level and the switching transistors CT1 and CT2 become conductive, the rise of the potential of the sensing node SN1 is small. Therefore, the voltage difference between the sensing nodes SN1 and SN2 is sufficiently large, and is certainly read out from the buffer circuit 5.

The present invention has been described with respect to a specific embodiment. However, other embodiments based on the principles of the present invention should be obvious to those of ordinary skill in the art. Such embodiments are intended to be covered by the claims.

What is claimed is:

1. A dynamic random access memory device in which a write operation is performed responsive to an internal write enable signal generated from a row address strobe signal, a column address strobe signal and an external write enable signal, comprising:
   memory cell means for storing a data;
   first and second bit lines being coupled to the memory cell means;
   sensing means for sensing the voltage difference between the bit lines;
   switching means connected between the sensing means and the memory cell means, for transferring the data stored in the memory cell means to the sensing means;
   first circuit means for generating a first control signal for making the switching means non-conductive during a first predetermined period;
   input means for inputting a data to the memory cell means through the bit lines responsive to the internal write enable signal; and
   second circuit means for generating the internal write enable signal, including delay means for delaying the termination of the internal write enable signal for a prescribed time after the termination of the first predetermined period if the external write enable signal occurs before the column address signal.

2. The dynamic random access memory device of claim 1, further comprising restore means for pulling-up the potential of one of the bit lines to a power source voltage.

3. The dynamic random access memory device of claim 2, wherein the switching means is connected between the memory means and the restore means.

4. The dynamic random access memory device of claim 2, wherein the switching means is connected between the restore means and the sensing means.

5. The dynamic random access memory device of claim 1, wherein the second circuit means includes,
   NOR gate for receiving the raw address strobe signal, the column address strobe signal and the external write enable signal, and outputting a first signal,
   first pulse generator responsive to the first signal for producing a second signal,
   flip-flop circuit responsive to the second signal and producing a third signal,
   delay means for delaying the third signal,
   second pulse generator for receiving the delayed third signal from the delay means, and for producing a fourth signal, and
   means for supplying the fourth signal to the flip-flop circuit, whereby the third signal is used as the internal write enable signal.

6. A method of writing data into a dynamic random access memory device including a switching transistor connected between bit line and sensing means, at a memory cell selected by a row address signal signal and a column address signal in response to an internal write enable signal, comprising the steps of:
   providing a row address strobe signal for accepting the row address signal;
   providing a column address strobe signal for accepting the column address signal;
   providing an external write enable signal for enabling the writing of the data;
   selecting the memory cell in response to the row address signal and the column address signal;
   generating a first control signal for activating the switching transistor;
   generating an internal write enable signal in the dynamic random access memory from the row address strobe signal, the column address signal and the external write enable signal;
   maintaining the internal write enable signal until a prescribed time after the termination of the first control signal if the external write enable signal occurs before the column address signal; and
   writing said data into said selected memory cell in response to the internal write enable signal.

7. The method of claim 6, further comprising the steps of:
   precharging the bit lines of the dynamic random access memory to a predetermined voltage VBL.

8. The method of claim 7, wherein the first control signal has as its high level power source voltage and as its low level VBL+Vth, wherein Vth is the threshold voltage of the switching transistor.

* * * * *